(12) United States Patent
Yang et al.

(10) Patent No.: US 7,955,971 B2
(45) Date of Patent: Jun. 7, 2011

(54) HYBRID METALLIC WIRE AND METHODS OF FABRICATING SAME

(75) Inventors: Chih-Chao Yang, Albany, NY (US); Kaushik Chanda, Hopewell Junction, NY (US); Daniel Edelstein, Yorktown Heights, NY (US); Baozhen Li, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/482,777

(22) Filed: Jun. 11, 2009

(65) Prior Publication Data

US 2010/0314764 A1    Dec. 16, 2010

(51) Int. Cl.
H01L 21/4763 (2006.01)

(52) U.S. Cl. ........ 438/643; 438/627; 438/653; 257/751; 257/761

(58) Field of Classification Search .................. 438/627, 438/643, 653; 257/751, 761–765
See application file for complete search history.

(56) References Cited

U.S. PATENT DOCUMENTS

| | | | |
|---|---|---|---|
| 4,707,391 A | 11/1987 | Hoffmann, Sr. | |
| 4,948,431 A | 8/1990 | Strickland et al. | |
| 5,298,099 A | 3/1994 | Hoffmann, Sr. | |
| 6,030,298 A | 2/2000 | Tate | |
| 6,050,905 A | 4/2000 | Tate | |
| 6,143,095 A | 11/2000 | Kim et al. | |
| 6,231,949 B1 | 5/2001 | Hoffmann, Sr. | |
| 6,627,292 B1 | 9/2003 | Hoffmann, Sr. | |
| 6,887,836 B2 | 5/2005 | Majeti et al. | |
| 7,069,830 B1 | 7/2006 | Meyer | |
| 7,220,454 B2 | 5/2007 | Barron et al. | |
| 7,273,048 B1 | 9/2007 | Zuzelo | |
| 7,553,757 B2 * | 6/2009 | Matsumori | 438/627 |
| 2003/0069668 A1 | 4/2003 | Zurn | |
| 2004/0236424 A1 | 11/2004 | Berez et al. | |
| 2005/0131128 A1 | 6/2005 | Hughes et al. | |
| 2005/0234461 A1 | 10/2005 | Burdulis et al. | |
| 2005/0267584 A1 | 12/2005 | Burdulis et al. | |
| 2006/0234497 A1 * | 10/2006 | Yang et al. | 438/638 |
| 2007/0179608 A1 | 8/2007 | Ek et al. | |
| 2007/0198022 A1 | 8/2007 | Lang et al. | |
| 2007/0205482 A1 * | 9/2007 | Yang et al. | 257/499 |
| 2007/0250169 A1 | 10/2007 | Lang | |
| 2008/0026568 A1 * | 1/2008 | Standaert et al. | 438/638 |

* cited by examiner

Primary Examiner — Zandra Smith
Assistant Examiner — Christy L Novacek
(74) Attorney, Agent, or Firm — Schmeiser, Olsen & Watts; Katherine S. Brown (57) ABSTRACT

A structure and methods of fabricating the structure. The structure comprising: a trench in a dielectric layer; an electrically conductive liner, an electrically conductive core conductor and an electrically conductive fill material filling voids between said liner and said core conductor.

30 Claims, 7 Drawing Sheets

HYBRID METALLIC WIRE AND METHODS OF FABRICATING SAME

FIELD OF THE INVENTION

The present invention relates to the field of integrated circuits; more specifically, it relates to hybrid wires for interconnecting devices into circuits, methods of fabricating hybrid wires and methods for repairing defects in wires during fabrication of integrated circuits.

BACKGROUND OF THE INVENTION

Integrated circuits utilize wires in wiring levels to interconnect devices such as transistors into circuits. As the size of integrated circuits decreases, there is a related decrease in the dimensions of the wires. This can lead to an increase in wire defects. Accordingly, there exists a need in the art to mitigate or eliminate the deficiencies and limitations described hereinabove.

SUMMARY OF THE INVENTION

A first aspect of the present invention is a structure, comprising: a trench in a dielectric layer; an electrically conductive first liner on a bottom of the trench and extending on adjacent lower regions of sidewalls of the trench, the first liner not extending to a top surface of the dielectric layer; an electrically conductive second liner on the first liner and extending on upper regions of the sidewalls of the trench adjacent to the lower regions of the sidewalls; and an electrically conductive core filling remaining space in the trench.

A second aspect of the present invention is a method, comprising: (a) forming a trench in a dielectric layer; (b) forming an electrically conductive first liner on a bottom of the trench and extending on adjacent lower regions of sidewalls of the trench, the first liner not extending to a top surface of the dielectric layer; (c) forming an electrically conductive second liner on the first liner and extending on upper regions of the sidewalls of the trench adjacent to the lower regions of the sidewalls; and (d) filling remaining space in the trench with an electrically conductive core.

A third aspect of the present invention is a method comprising: (a) forming a hardmask layer on the top surface of the dielectric layer, (b) forming an opening in the hardmask layer; (c) etching the trench into the into the dielectric layer through the opening, after the etching the hardmask layer overhanging a perimeter of the trench; (d) depositing an electrically conductive liner on the hardmask layer and on a bottom of the trench and sidewalls of the trench, the liner not formed on regions of the sidewalls adjacent to a top surface of the dielectric layer; (e) forming a seed layer on the liner, plating copper on the seed layer, and performing a chemical mechanical polish to remove the hardmask layer and to remove any liner, seed layer and plated copper not in the trench, the chemical mechanical polishing exposing voids between the plated copper in the trench the regions of the sidewalls having no liner; and (f) selectively filling the regions with an electrically conductive fill material.

A fourth aspect of the present invention is a method comprising: (a) forming a hardmask layer on the top surface of the dielectric layer, (b) forming an opening in the hardmask layer; (c) etching the trench into the into the dielectric layer through the opening; (d) depositing an electrically conductive liner on the hardmask layer and on a bottom of the trench and sidewalls of the trench; (e) forming a seed layer on the liner, plating copper on the seed layer, and performing a chemical mechanical polish to remove the hardmask layer and to remove any liner, seed layer and plated copper not in the trench; (f) removing a perimeter region of the plated copper adjacent to a top surface of the plated copper and between the plated copper and the liner to form a perimeter trench in the plated copper; and (g) selectively filling the perimeter trench with an electrically conductive fill material.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A newly discovered wire defect has resulted in a defect called "slit-voids" in copper damascene wires. The root-cause mechanism is related to the undercut of the hardmask used to define the trenches in the inter-level dielectric (ILD) in which the wires are formed.

A damascene wire is formed by a damascene process and a dual-damascene wire is formed by a dual-damascene process. There may be multiple damascene and/or dual-damascene wiring levels in an integrated circuit chip.

A damascene process is one in which wire trenches or via openings are defined by a patterned hardmask layer and etched into an underlying ILD layer, an electrical conductor of sufficient thickness to fill the trenches is deposited, and a chemical-mechanical-polish (CMP) process is performed to remove excess conductor and the hardmask layer and to make the surface of the conductor co-planar with the surface of the dielectric layer to form damascene wires (or damascene vias). When only a trench and a wire (or a via opening and a via) is formed the process is called single-damascene. The pattern in the hardmask is photolithographically defined.

A dual dual-damascene process is one in which wire trenches are defined by a patterned hardmask layer and etched partway into an underlying ILD layer followed by formation of vias inside the trenches through the remaining thickness of the ILD layer in cross-sectional view. All via openings are intersected by integral wire trenches above and by a wire trench below, but not all trenches need intersect a via opening. Thereafter the process is the same as for single-damascene wires.

Figure 1A:
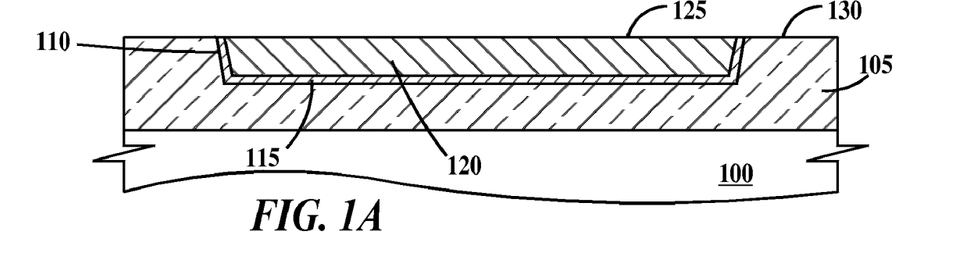
FIGS. 1A and 1B are cross-sections of exemplary damascene and dual-damascene wire respectively.
Figure 1B:
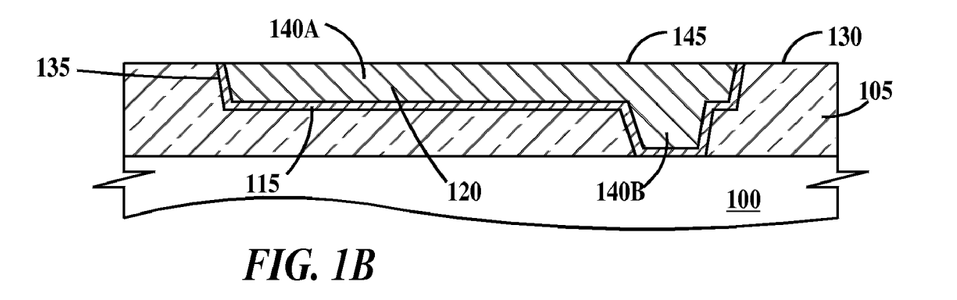

FIGS. 1A and 1B are cross-sections of exemplary damascene and dual-damascene wire respectively. In FIG. 1A, formed on a substrate 100 is an ILD layer 105. Substrate 100 includes a semiconductor (e.g., silicon) layer on/and in which various dielectric and conductive layers have been built up to form devices such as transistors. Substrate 100 may also include other wiring levels having wires formed in respective ILD layers. A damascene wire 110 is formed in ILD layer 105. Wire 110 includes an electrically conductive liner 115 and on the sidewalls and bottom of an electrical core conductor 120. A top surface 125 of wire 110 is coplanar with a top surface 130 of ILD layer 105.

In one example, liner 115 comprises a layer of tantalum nitride (TaN) on a layer of tantalum (Ta), with the Ta between the TaN and core conductor 120. Core conductor 120 comprises a thin seed layer of evaporated or sputter deposited copper (Cu) on the liner and plated Cu filling the remaining space.

In one example, ILD layer 105 comprises a porous or nonporous silicon dioxide ($SiO_2$), fluorinated $SiO_2$ (FSG) or a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. A low K dielectric material has a relative permittivity of about 2.4 or less. In one example, ILD layer 105 is between about 300 nm and about 700 nm thick.

In FIG. 1B, a dual-damascene wire 135 is formed in ILD layer 105. Wire 135 includes wire portion 140A and an integral via portion 140B. Wire 135 includes electrically conductive liner 115 and on the sidewalls and bottom of electrical core conductor 120. A top surface 145 of wire 135 is coplanar with top surface 130 of ILD layer 105.

Hereinafter, single-damascene wires and processes will be used in illustrating and describing the various features and embodiments of the invention. However, the present invention is equally applicable to dual-damascene wires and the term damascene hereinafter should be interpreted to include both single-damascene and dual-damascene wires.

Figure 2A:
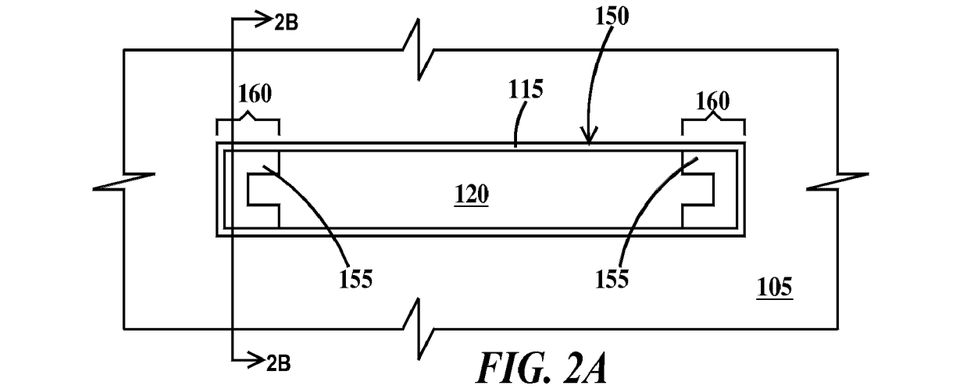
FIG. 2A is a top view and FIG. 2B is a cross-section view through line 2B-2B of FIG. 2A illustrating a first exemplary slit-void wire defect.
Figure 2B:
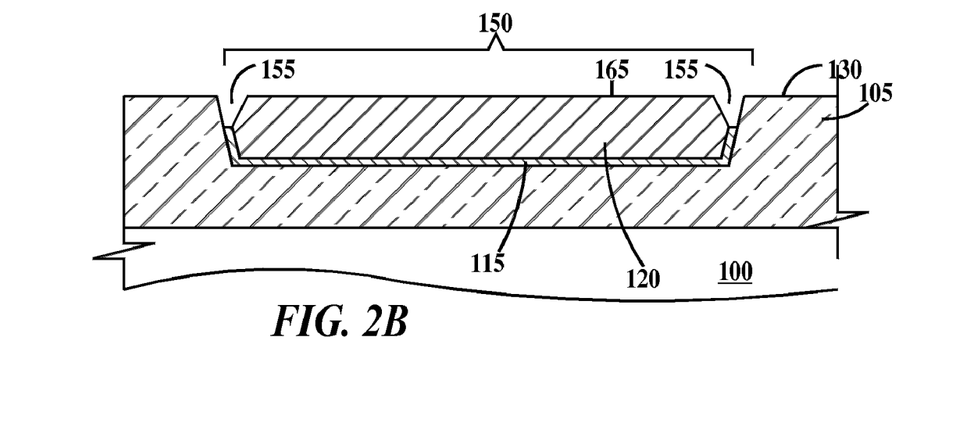

FIG. 2A is a top view and FIG. 2B is a cross-section view through line 2B-2B of FIG. 2A illustrating a first exemplary slit-void wire defect. In FIGS. 2A and 2B a damascene wire 150 is formed in ILD layer 105 and includes liner 115 and core conductor 120. Slit-void defects 155 are formed along the perimeter of wire 150 at the distal ends 160 of wire 150. A top surface 165 of wire 150 (where there are no slit-voids 155) is coplanar with top surface 130 of ILD layer 105. In FIG. 2B, it can be seen that voids 155 are due to an absence of both liner 115 and core conductor 120. Voids 155 extend from top surface 165 of wire 150 into wire 150 but do not extend to the bottom of wire 150. Note voids 155 are "U" shaped.

Figure 2C:
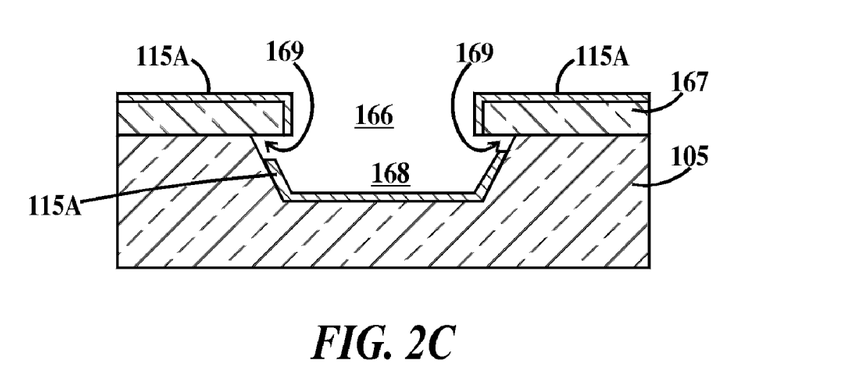
FIG. 2C is a cross-section view illustrating the root cause of slit-void defects.

FIG. 2C is a cross-section view illustrating the root cause of slit-void defects. In FIG. 2C, an opening 166 is formed in a hardmask layer 167 and a trench 168 is formed in ILD layer 105. The etching of trench 168 created an overhang 169 of hardmask layer 167. Overhang 169 "shadows" the formation of liner/seed layer 115A so the liner and seed layer do not extend up the sidewalls of the trench to hardmask layer 167. During Cu plating, for a significant number of wires (e.g. about 3% to about 7%), the distal ends of the trench 166 will not be completely filled with Cu where there is no liner/seed layer 115 and a void is thereby formed.

Figure 3A:
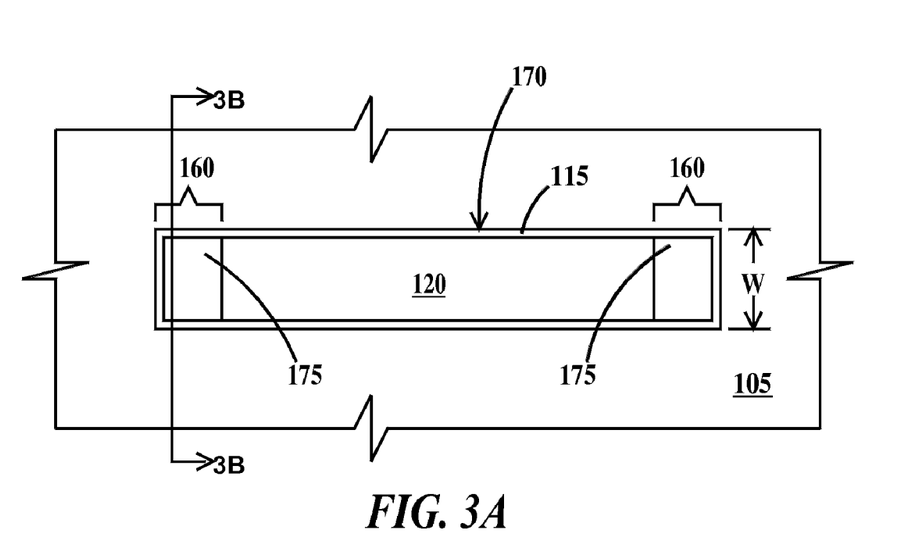
FIG. 3A is a top view and FIG. 3B is a cross-section view through line 3B-3B of FIG. 3A illustrating a second exemplary slit-void wire defect.
Figure 3B:
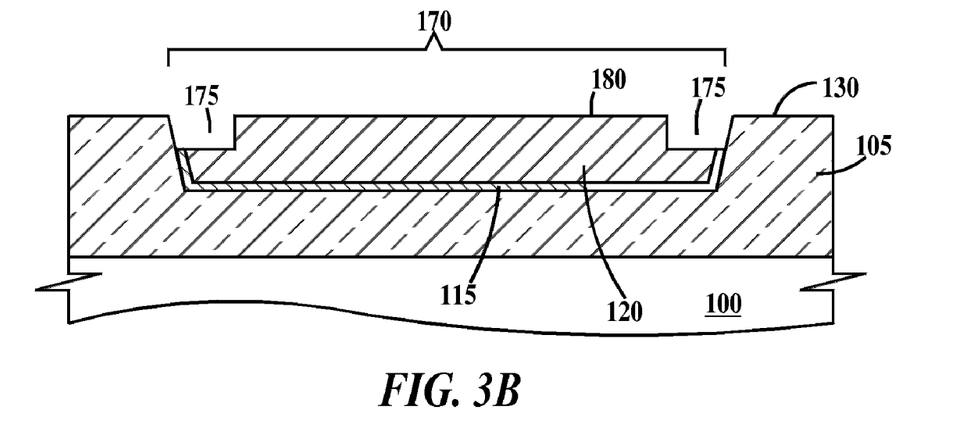

FIG. 3A is a top view and FIG. 3B is a cross-section view through line 3B-3B of FIG. 3A illustrating a second exemplary slit-void wire defect. In FIGS. 3A and 3B a damascene wire 170 is formed in ILD layer 105 and includes liner 115 and core conductor 120. Slit-void defects 175 are formed at the distal ends 160 of wire 170. A top surface 180 of wire 170 (where there are no slit-voids 175) is coplanar with top surface 130 of ILD layer 105. In FIG. 3B, it can be seen that voids 175 are due to an absence of both liner 115 and core conductor 120. Voids 175 extend from top surface 180 of wire 170 into wire 170 but do not extend to the bottom of wire 170. Note voids 175 extend across the entire width W of wire 175 at distal ends 160.

Figure 4A:
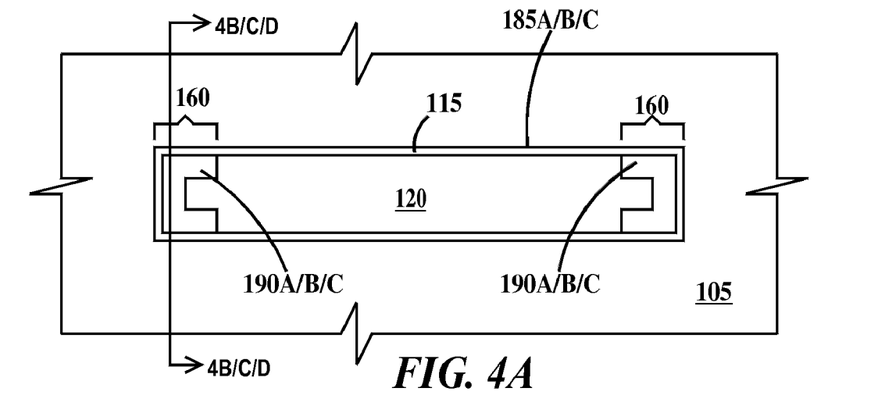
FIG. 4A is a top view and FIGS. 4B/4C/4D are a cross-section views through respective lines 4B-4B/4C-4C/4D-4D of FIG. 4A illustrating a method of repairing the wire defect of FIGS. 2A/2B and FIGS. 3A/3B according to embodiments of the present invention.
Figure 4B:
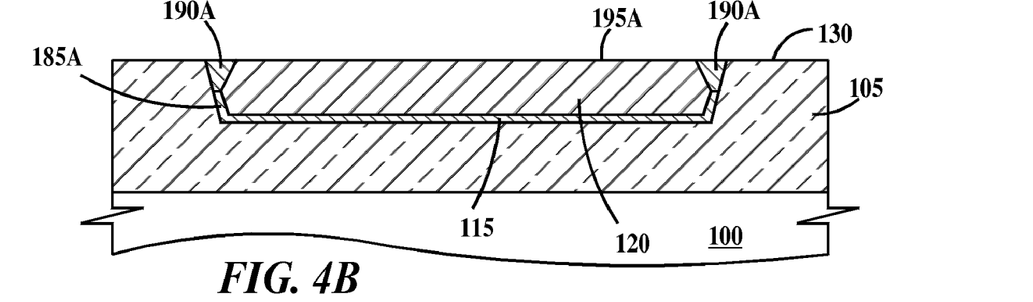
Figure 4C:
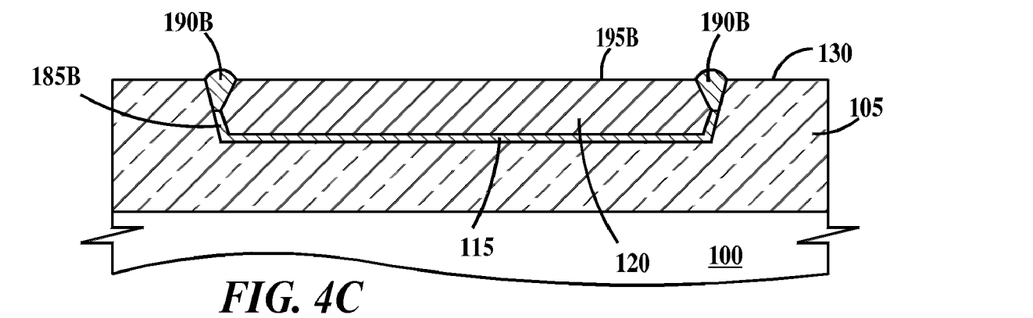
Figure 4D:
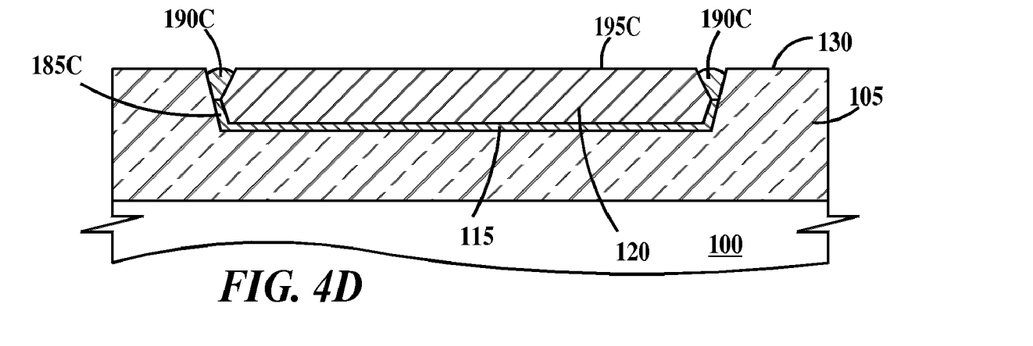

FIG. 4A is a top view and FIGS. 4B/4C/4D are a cross-section views through respective lines 4B-4B/4C-4C/4D-4D of FIG. 4A illustrating a method of repairing the wire defect of FIGS. 2A/2B and FIGS. 3A/3B according to embodiments of the present invention. The defects shown in FIGS. 2A and 2B will be used in an example of the repair process, but the process is equally applicable to the defects of FIGS. 3A and 3B and other slit-void defects. FIG. 4A is similar to FIG. 2A except wires 185A or 185B or 185C have respective metal fillings 190A or 190B or 190C replacing (i.e., filling in) void 155 of FIG. 2A. In FIG. 4B, top surface of filling 190A is coplanar with a top surface 195A of core conductor 120 of wire 185A. In FIG. 4C, at least a region of a top surface of filling 190B extends above a top surface 195B of core conductor 120 of wire 185B. In FIG. 4D, at least a region of a top surface of filling 190C is extends below a top surface 195C of core conductor 120 of wire 185C.

Fillings 190A, 190B and 190C are formed by selective deposition of the fill metal on Cu. The selective deposition technique includes chemical vapor deposition (CVD), atomic layer deposition (ALD), or electroless deposition. Selective processes according to embodiments of the present invention involve self-complementary materials and are self-limiting depositions of a metal from a reactive vapor phase compound of the metal exclusively on exposed copper. Examples of suitable metals include ruthenium (Ru), cobalt (Co), titanium (Ti), palladium (Pd), nickel (Ni), gold (Au), iridium (Ir), manganese (Mn), and tungsten (W) with Ru, Mn and Co preferred and Ru most preferred. Ru may be selectively deposited on Cu using triruthenium dodecacarbonyl ($Ru_3(CO)_{12}$) precursor in a CVD reaction. Such a processes is described in United States Patent Publication 2008/0315429 by McFeely et al. and is hereby incorporated by reference in its entirety. Co may be selectively deposited on Cu using dicarbonyl (h5-2,4-cycopentadien-1-yl)Co precursor in a CVD reaction.

Optionally, filling 190A of FIG. 4B may be formed from filling 190B of FIG. 4C by CMP of filling 190B.

Figure 5A:
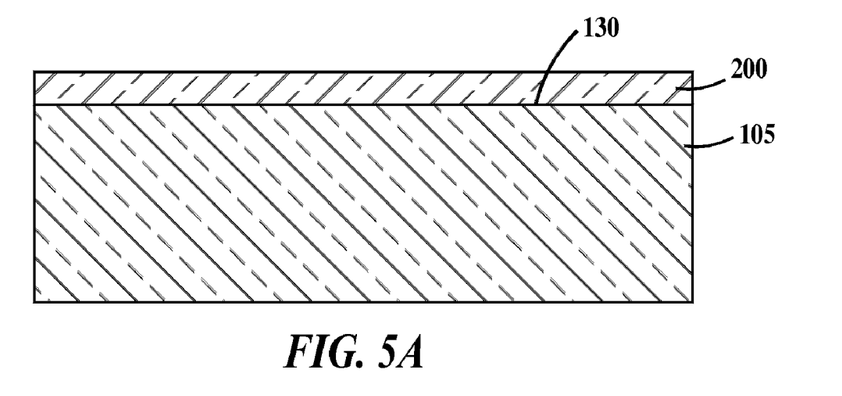
FIGS. 5A through 5H are cross-sections illustrating fabrication of a hybrid wire according to embodiments of the present invention.

FIGS. 5A through 5H are cross-sections illustrating fabrication of a hybrid wire according to embodiments of the present invention. In FIG. 5A, a hardmask layer 200 is formed on top surface 130 of ILD layer 105. In one example hardmask layer is silicon nitride ($Si_3N_4$). In one example, hardmask layer is $SiO_2$ when ILD layer 105 is not $SiO_2$ or is a low K dielectric such as SiCOH. In one example, hardmask layer is between about 10 nm and about 80 nm thick.

Figure 5B:
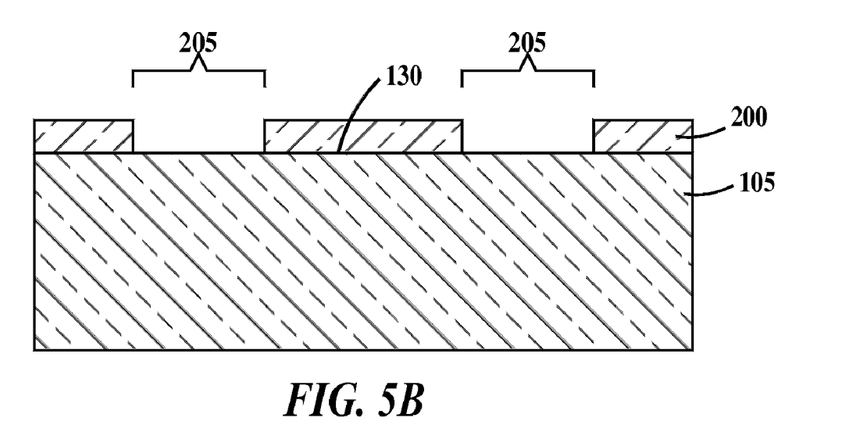

In FIG. 5B, openings 205 are formed in hardmask layer 200 using a photolithographic process. For example, a photoresist layer is applied to the top surface of hardmask layer, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After etching (e.g., by reactive ion etch (RIE)) hardmask layer 200, the patterned photoresist is removed.

Figure 5C:
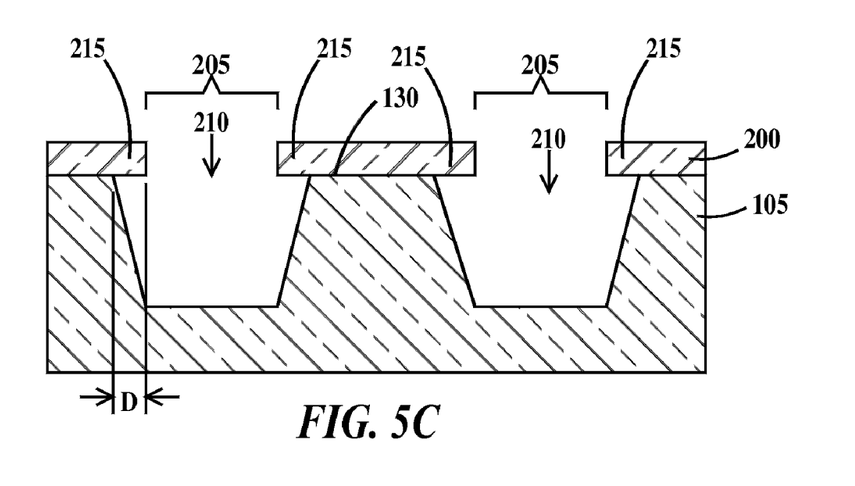

In FIG. 5C, trenches 210 are etched (e.g., by RIE) into ILD layer 105. Lateral etching of trenches 210 creates overhangs 215 in hardmask layer 200. Low K and porous dielectric materials are more susceptible to lateral etching than conventional dielectric layers such as $SiO_2$. The RIE process may be adjusted to control the distance D of overhangs 215. Greater overhang results in more shadowing of subsequent depositions/evaporations as described infra.

Figure 5D:
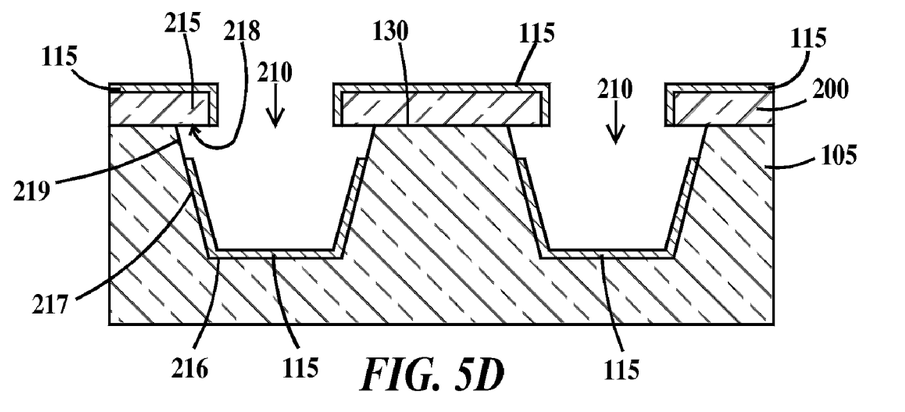

In FIG. 5D, liner (or first liner) 115 is formed (e.g., by evaporation or sputter deposition) on bottoms 216 and sidewalls 217 of trenches 210 and all exposed surfaces of hardmask layer except surfaces 218 of overhangs 215. However, because of shadowing, liner 115 is not formed on regions 219 of sidewalls 217 adjacent to top surface 130 of ILD layer 105. Liner 115 does not extend along sidewall 217 all the way up to top surface 130 of ILD layer 105.

Figure 5E:
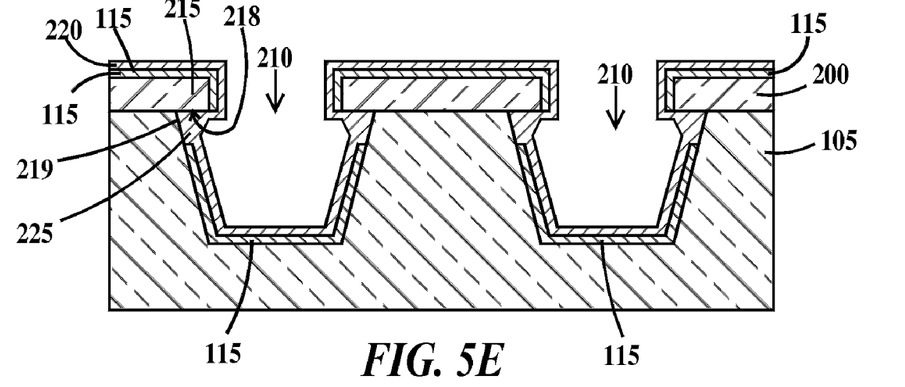

In FIG. 5E, an electrically conductive corner-liner (or second liner) 220 is formed on liner 115, regions 219 of sidewalls 217 and surface 218 of overhangs 215. In one example corner-liner 220 comprises Ru, Co, Ti, Pd, Ni, Au, Ir, Mn, or W with Ru, Mn and Co preferred and Ru most preferred. In one example, corner-liner 220 is formed from non-selective CVD or atomic layer deposition (ALD). Because of the "corner" at the interface of surfaces 218 and 219, corner-liner 220 is thickest in region 225 of corner-liner 220 due to two surfaces of corner-liner 220 growing toward each other during deposition.

Figure 5F:
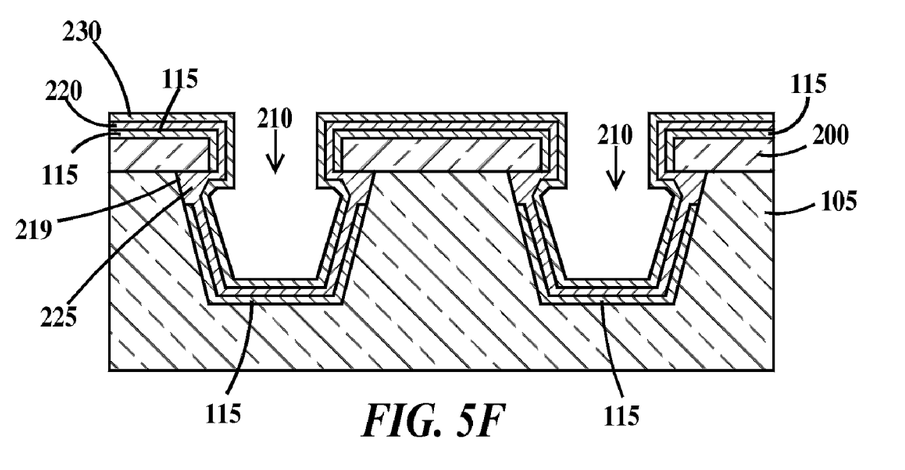

In FIG. 5F, optional Cu seed layer 230 is formed on corner-liner 220. Seed layer 230 is required in the event that the core conductor will be plated Cu.

Figure 5G:
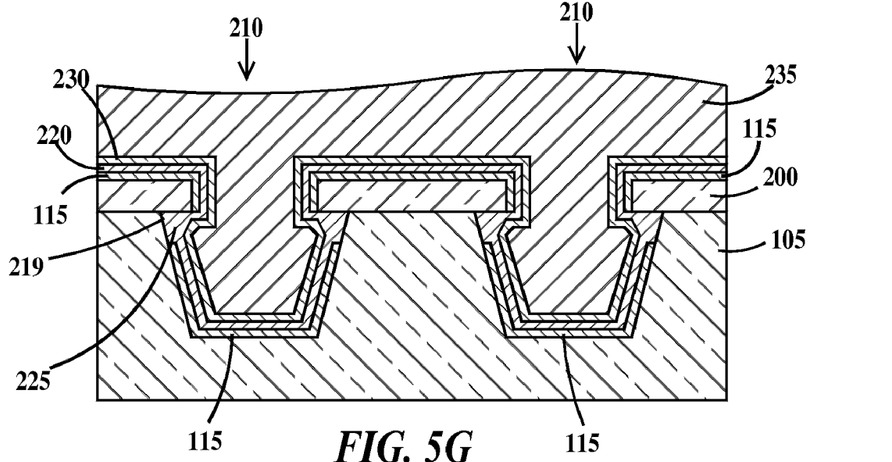

In FIG. 5G, a layer of core conductor 235 is formed on top of seed layer 230 (if present, or corner liner 225 if there is no seed layer). Core conductor 235 completely fills remaining space in trench 210. In one example, core conductor 235 is plated Cu. In one example core conductor 235 is aluminum (Al) formed by physical vapor deposition (PVD) followed by a reflow (i.e., heating process). When core conductor 235 is Al, in one example, liner 115 comprises a layer of titanium nitride (TiN) on a layer of Ti, with the Ti between the TiN and Al.

Figure 5H:
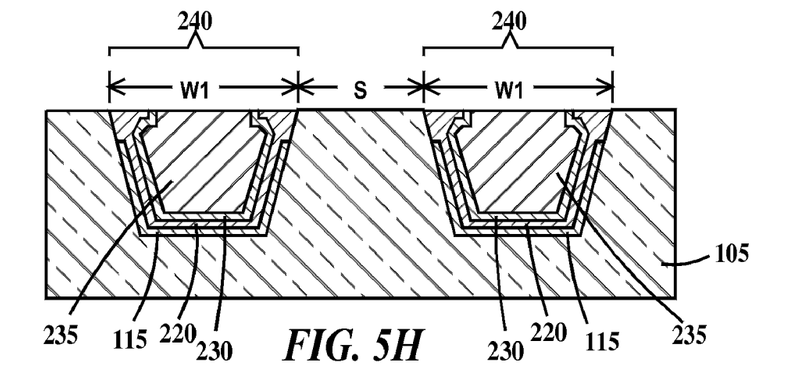

In FIG. 5H, a CMP has been performed removing all of core conductor 235, of liner 115, corner-liner 220 and seed layer 230 above top surface 130 of ILD layer and all of hardmask layer 200 (see FIG. 5G) to form hybrid damascene wires 240. Wires 240 have a width W1 and are spaced apart a distance S. In one example W1=S=about 40 nm to about 200 nm.

Figure 6:
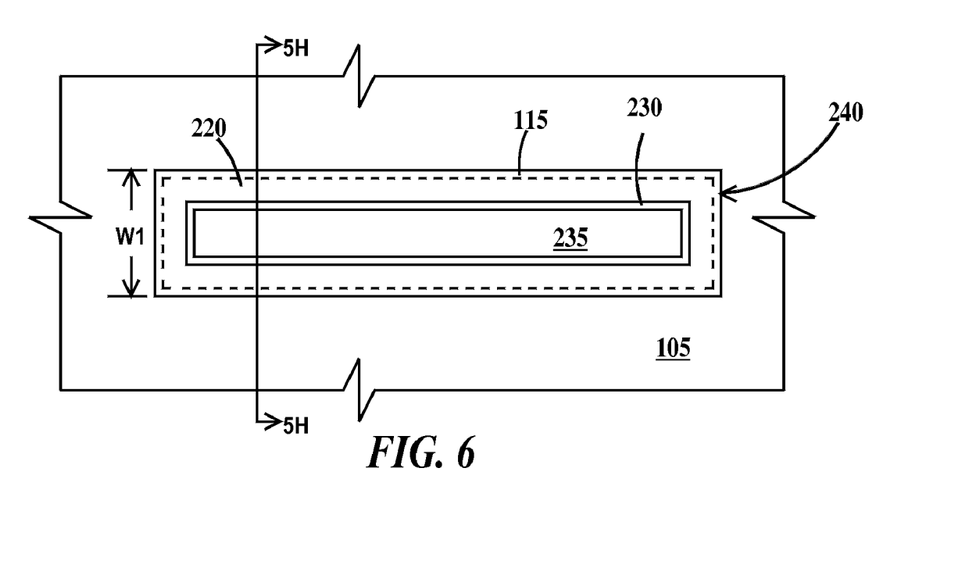
FIG. 6 is a top view of a hybrid wire of FIG. 5H.

FIG. 6 is a top view of a hybrid wire of FIG. 5H. In FIG. 6, wire 240 includes a ring of corner-liner 220 around the entire perimeter of wire 240 and a ring of liner 115 between corner-liner 220 and core conductor 235. Seed layer 230 (if present) is a ring between corner-liner 220 and core conductor 235.

Figure 7A:
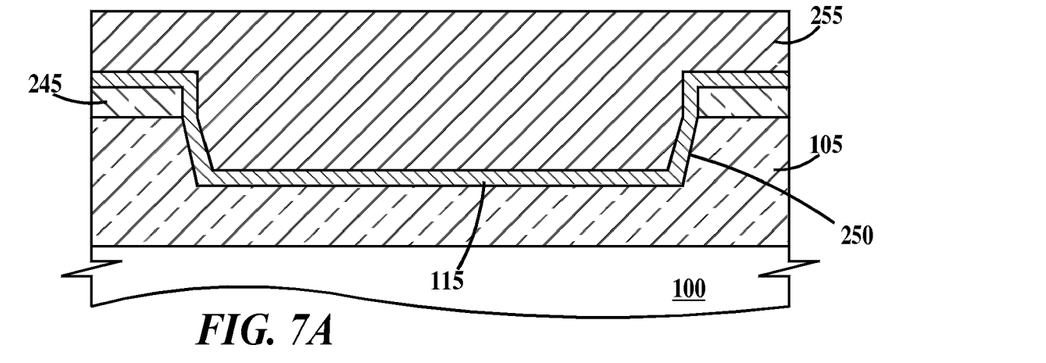
FIGS. 7A through 7C are cross-sections and FIG. 7D is a top view of an alternative method of fabricating a hybrid wire according to embodiments of the present invention.
Figure 7B:
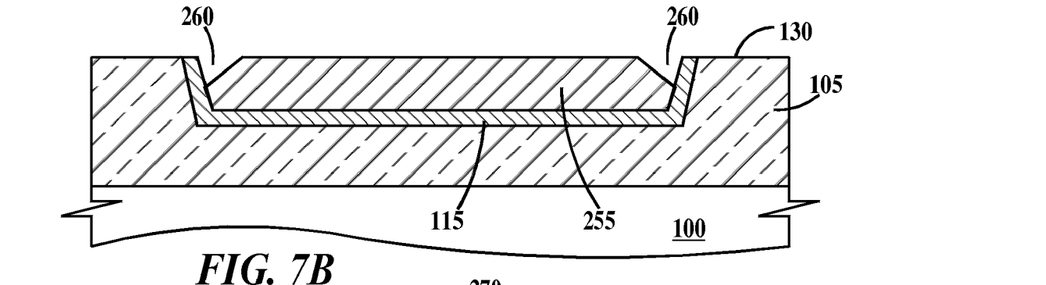
Figure 7C:
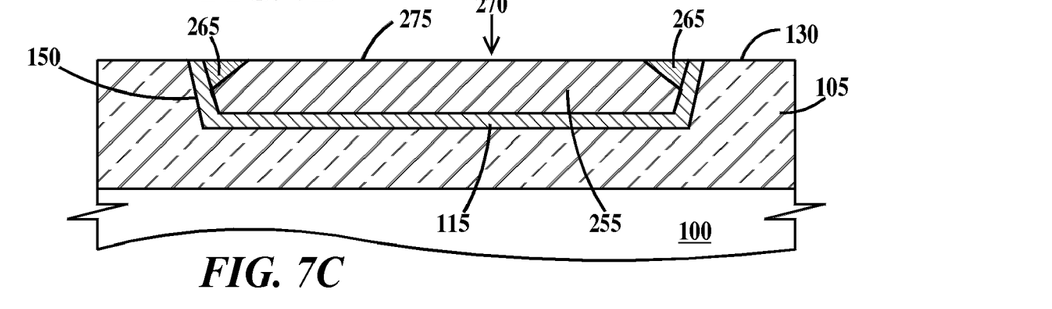
Figure 7D:
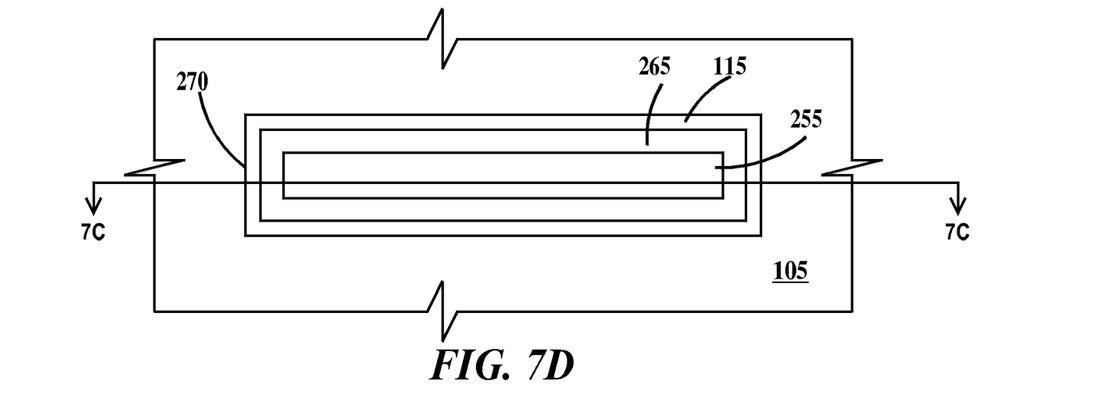

FIGS. 7A through 7C are cross-sections and FIG. 7D is a top view of an alternative method of fabricating a hybrid wire according to embodiments of the present invention. In FIG. 7A, formation of a damascene wire has proceeded to the point just prior to CMP. A hardmask 245 has been patterned, a liner 115 formed on the sidewalls and the bottom of a trench 250 in ILD layer 105 and a layer of core conductor 255 fills the trench. A seed layer of Cu as described supra may or may not be present and is not shown in FIGS. 7A through 7D. Core conductor may be Cu or Al.

In FIG. 7B a CMP has been performed to coplanarize core conductor 255, edges of liner 115 and top surface 130 of ILD layer 105 followed by an oxidizing etch. Slit voids 260 are formed around the entire perimeter of core conductor 255. The extent and depth of slit-voids 260 is be controlled by the oxidizing etch process.

In FIG. 7C, the slit-voids of FIG. 7B are filled with fill 265 to form a hybrid damascene wire 270. Fill 265 is formed by the same process and of the same materials as fill 190A of FIG. 4B, 190B of FIG. 4C or fill 190C of FIG. 4D. While fill 265 is shown coplanar with ILD layer 105 and core conductor 255, it may be raised above (as in FIG. 4C) or recessed below (as in FIG. 4D) the plane defined by top surface 130 of ILD layer 105. Fill 265 is formed around the entire perimeter of core conductor 255 between the core conductor and liner 115 as illustrated in FIG. 7D. Fill 265 extends from a top surface 275 of wire 270 into wire 270 but does not extend to the bottom of wire 270.

Thus, the embodiments of the present invention provide hybrid wires for interconnecting devices of integrated circuits into circuits, methods of fabricating hybrid wires and methods for repairing defects in wires during fabrication of integrated circuits thereby mitigating or eliminating the deficiencies and limitations described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
  a trench in a dielectric layer on a top surface of a substrate;
  a via in a bottom surface of said trench, said via extending to said top surface of said substrate, regions of said dielectric layer intervening between a bottom of said trench and said substrate;
  an electrically conductive first liner on a bottom of said via, on entire sidewalls of said via, on said bottom of said trench and extending on adjacent lower regions of sidewalls of said trench, said first liner not extending to a top surface of said dielectric layer;
  an electrically conductive second liner on said first liner and extending on upper regions of said sidewalls of said trench adjacent to said lower regions of said sidewalls; and
  an electrically conductive core in said trench and in said via.

2. The structure of claim 1, wherein top surfaces of said core conductor, said second liner and said dielectric layer are coplanar.

3. The structure of claim 1, wherein said second liner extends along the entire perimeter of said trench.

4. The structure of claim 1, wherein said core conductor comprises copper, said first liner comprises a tantalum layer on a tantalum nitride layer, said tantalum layer between said tantalum nitride layer and said core conductor, and said second liner comprises ruthenium, manganese or cobalt.

5. The structure of claim 1, wherein said core conductor comprises aluminum, said first liner comprises a titanium layer on a titanium nitride layer, said titanium layer between said titanium nitride layer and said core conductor, and said second liner comprises ruthenium, manganese or cobalt.

6. The structure of claim 1, wherein said bottom of said trench is flat.

7. The structure of claim 1, wherein said bottom of said via is flat.

8. The structure of claim 1, further including:
a third liner on said first and second liners.

9. The structure of claim 8, wherein said core fills remaining space in said trench and said via.

10. The structure of claim 1, wherein said core fills remaining space in said trench and said via.

11. A method, comprising:
(a) forming a trench in a dielectric layer on a top surface of a substrate and forming a via in a bottom surface of said trench, said via extending to said top surface of said substrate, regions of said dielectric layer intervening between a bottom of said trench and said substrate;
(b) forming an electrically conductive first liner on a bottom of said via, on entire sidewalls of said via, on said bottom of said trench and extending on adjacent lower regions of sidewalls of said trench, said first liner not extending to a top surface of said dielectric layer;
(c) forming an electrically conductive second liner on said first liner and extending on upper regions of said sidewalls of said trench adjacent to said lower regions of said sidewalls; and
(d) forming an electrically conductive core in said trench and in said via.

12. The method of claim 11, wherein (a) includes:
forming a hardmask layer on said top surface of said dielectric layer,
forming an opening in said hardmask layer; and
etching said trench into said into said dielectric layer through said opening, after said etching, said hardmask layer overhangs a perimeter of said trench.

13. The method of claim 12, wherein:
(b) includes forming said first liner on said hardmask layer;
(c) includes forming said second liner on said first liner; and
(d) includes forming a copper seed layer on said second liner, plating copper on said seed layer to fill said trench, and performing a chemical mechanical polish to remove said hardmask layer and to remove any first liner, second liner, seed layer and plated copper not in said trench.

14. The method of claim 11, wherein (c) includes:
forming said second liner on regions of said sidewalls not covered by said first liner.

15. The method of claim 11, wherein top surfaces of said core conductor, said second liner and said dielectric layer are coplanar.

16. The method of claim 11, wherein said second liner extends along the entire perimeter of said trench.

17. The method of claim 11, wherein said core conductor comprises copper, said first liner comprises a tantalum layer on a tantalum nitride layer, said tantalum layer between said tantalum nitride layer and said core conductor, and said second liner comprises ruthenium, manganese or cobalt.

18. The method of claim 11, wherein said core conductor comprises aluminum, said first liner comprises a titanium layer on a titanium nitride layer, said titanium layer between said titanium nitride layer and said core conductor, and said second liner comprises ruthenium, manganese or cobalt.

19. The method of claim 11, wherein said bottom of said trench is flat.

20. The method of claim 11, wherein said bottom of said via is flat.

21. The method of claim 11, further including:
a third liner on said first and second liners.

22. The method of claim 21, wherein said core fills remaining space in said trench and said via.

23. The method of claim 11, wherein said core fills remaining space in said trench and said via.

24. A method comprising:
(a) forming a hardmask layer on said top surface of said dielectric layer,
(b) forming an opening in said hardmask layer;
(c) etching said trench into said into said dielectric layer through said opening, after said etching, said hardmask layer overhangs a perimeter of said trench;
(d) depositing an electrically conductive liner on said hardmask layer and on a bottom of said trench and sidewalls of said trench, said liner not formed on regions of said sidewalls adjacent to a top surface of said dielectric layer;
(e) forming a seed layer on said liner, plating copper on said seed layer, and performing a chemical mechanical polish to remove said hardmask layer and to remove any liner, seed layer and plated copper not in said trench, said chemical mechanical polishing exposing voids between said plated copper in said trench said regions of said sidewalls having no liner; and
(f) selectively filling said regions with an electrically conductive fill material.

25. The method of claim 24, said liner comprises a tantalum layer on a tantalum nitride layer, said tantalum layer between said tantalum nitride layer and said core conductor, and said fill material comprises ruthenium or cobalt.

26. The method of claim 25, wherein said selectively filling said regions comprises a selective deposition of said fill material on copper in said voids, said selective deposition selected from the group consisting of chemical vapor deposition, atomic layer deposition and electroless deposition.

27. The method of claim 24, wherein said voids are formed at an end of said trench.

28. A method comprising:
(a) forming a hardmask layer on said top surface of said dielectric layer,
(b) forming an opening in said hardmask layer;
(c) etching said trench into said into said dielectric layer through said opening;
(d) depositing an electrically conductive liner on said hardmask layer and on a bottom of said trench and sidewalls of said trench;
(e) forming a seed layer on said liner, plating copper on said seed layer, and performing a chemical mechanical polish to remove said hardmask layer and to remove any liner, seed layer and plated copper not in said trench;
(f) removing a perimeter region of said plated copper adjacent to a top surface of said plated copper and between said plated copper and said liner to form a perimeter trench in said plated copper; and
(g) selectively filling said perimeter trench with an electrically conductive fill material.

29. The method of claim 28, said liner comprises tantalum layer on a tantalum nitride layer, said tantalum layer between said tantalum nitride layer and said core conductor, and said fill material comprises ruthenium, manganese or cobalt.

30. The method of claim 28, wherein said selectively filling said regions comprises a selective deposition of said fill material on copper in said voids, said selective deposition selected from the group consisting of chemical vapor deposition, atomic layer deposition and electroless deposition.

* * * * *